US012719494B2

(12) United States Patent
Dempsey

(10) Patent No.: US 12,719,494 B2
(45) Date of Patent: Aug. 25, 2026

(54) DATA CONVERTER SYSTEMS AND METHODS

(71) Applicant: Analog Devices International Unlimited Company, Limerick (IE)

(72) Inventor: Dennis A. Dempsey, Newport (IE)

(73) Assignee: Analog Devices International Unlimited Company, Limerick (IE)

(*) Notice: Subject to any disclaimer, the term of this patent is extended or adjusted under 35 U.S.C. 154(b) by 106 days.

(21) Appl. No.: 18/805,045

(22) Filed: Aug. 14, 2024

(65) Prior Publication Data

US 2026/0051899 A1 Feb. 19, 2026

(51) Int. Cl.
*H03M 1/66* (2006.01)

(52) U.S. Cl.
CPC .................................... *H03M 1/66* (2013.01)

(58) Field of Classification Search
CPC ..... H03M 1/0604; H03M 1/662; H03M 1/742
See application file for complete search history.

(56) References Cited

U.S. PATENT DOCUMENTS 2,605,361 A 7/1952 Cutler
6,198,313 B1 3/2001 Poucher et al.
9,948,315 B2 4/2018 Dempsey
10,848,166 B1 * 11/2020 Reitsma ................ H03M 1/002
11,050,431 B1 * 6/2021 Ma ...................... H03M 1/0697
11,133,814 B1 * 9/2021 Patil ...................... H03M 1/124
11,218,158 B1 * 1/2022 Patil .................... H03M 1/1071
11,888,498 B2 * 1/2024 Saari ................... H03M 1/0624
2005/0001750 A1 * 1/2005 Lo ...................... H03M 7/3015 341/143
2015/0365644 A1 * 12/2015 Kawakami ........... H04N 19/172 348/231.1
2016/0291610 A1 * 10/2016 Kashima .............. G05D 11/132
2017/0350923 A1 * 12/2017 Mostert .................... H04R 3/00
2017/0359077 A1 * 12/2017 Dempsey ................ H03M 1/70
2017/0359079 A1 * 12/2017 Dempsey ............ H03M 1/1009

OTHER PUBLICATIONS

Fredenburg, Jeffrey, et al., "A 90MS/s 11MHz Bandwidth 62dB SNDR Noise-ShapingSAR ADC", ISSCC 2012 / SESSION 27 / Data Converter Techniques / 27.6; IEEE International Solid States Circuit Conference(ISSCC), 2012, (2012), 468-470.

* cited by examiner

*Primary Examiner* — Lam T Mai
(74) *Attorney, Agent, or Firm* — Schwegman Lundberg & Woessner, P.A.

(57) ABSTRACT

The present disclosure relates to a data converter system and a method for operating the data converter system. Rather than determining a new input to a data converter using a controller, edge processing is used to reduce controller signal processing requirements by utilising processing taking place at the data converter itself. This reduces the data transmission requirements between the components, thus decreasing latency in the system.

20 Claims, 10 Drawing Sheets

DATA CONVERTER SYSTEMS AND METHODS

TECHNICAL FIELD

The present disclosure relates to an apparatus and method for conversion of data or information.

BACKGROUND

Data converters convert data from one form to another. Digital-to-analog converters (DACs) convert digital input codes into analog output signals. DACs may also achieve this analog conversion by quantized variation of impedances such as a capacitive DAC or a digitally variable potentiometer or rheostat. Analog-to-digital converters (ADCs) convert analog input signals into digital output codes. ADCs and DACs are widely used in a variety of applications, such as signal processing, control and biasing.

In a typical control system, an analog feedback signal is received from an external system, converted to a digital signal, processed using a microprocessor to generate a digital control signal based on the digital representation of the feedback signal, converted to an analog control signal and provided to the external system.

The conversion from analog to digital and digital to analog allows a digital controller to be used, however the conversions and processing of the data conversions introduce latency and delay the provision of a control signal, as well as increasing the power consumed by the control system. Where the system includes multiple components, the transmission of data or information between components, especially serial data, further increases latency and power consumption.

SUMMARY

The present inventors have recognized, among other things, a need to provide an improved system and method that reduces the delay and power consumption of data converter systems.

There is provided a method of data conversion. In the method, data communication between a controller and data conversion is reduced by increasing the processing taking place at the data converter.

According to a first aspect of the disclosure, there is provided a method of operating a data converter system, the method comprising: receiving an input signal at the data converter system; determining, by a controller of the data converter system, a difference between a value of the input signal and a target value; communicating the difference from the controller to a data converter of the data converter system; generating, by the data converter, an actuation signal based on the difference; outputting the actuation signal in order to control a circuit external to the data converter system.

According to a second aspect of the disclosure, there is provided a data converter system configured to receive an input signal and output an actuation signal, wherein the data converter system comprises: a controller configured to receive the input signal and determine a difference between a value of the input signal and a target value; a data converter configured to receive the difference from the controller and generate an actuation signal based on the difference, the data converter configured to output the actuation signal in order to control a circuit external to the data converter system.

According to a third aspect of the disclosure, there is provided a method of operating a data converter system, the method comprising: receiving a digital input signal at the data converter system; determining, by a controller of the data converter system, a difference between a value of the digital input signal and a target value; communicating the difference from the controller to a digital-to-analog converter, DAC, of the data converter system; generating, by the DAC, an analog actuation signal based on the difference; outputting the actuation signal in order to control a circuit external to the data converter system.

BRIEF DESCRIPTION OF THE DRAWINGS

Aspects of the disclosure will now be described by way of example only and with reference to the accompanying drawings, wherein like reference numerals refer to like parts, and wherein.

DETAILED DESCRIPTION

Figure 1:
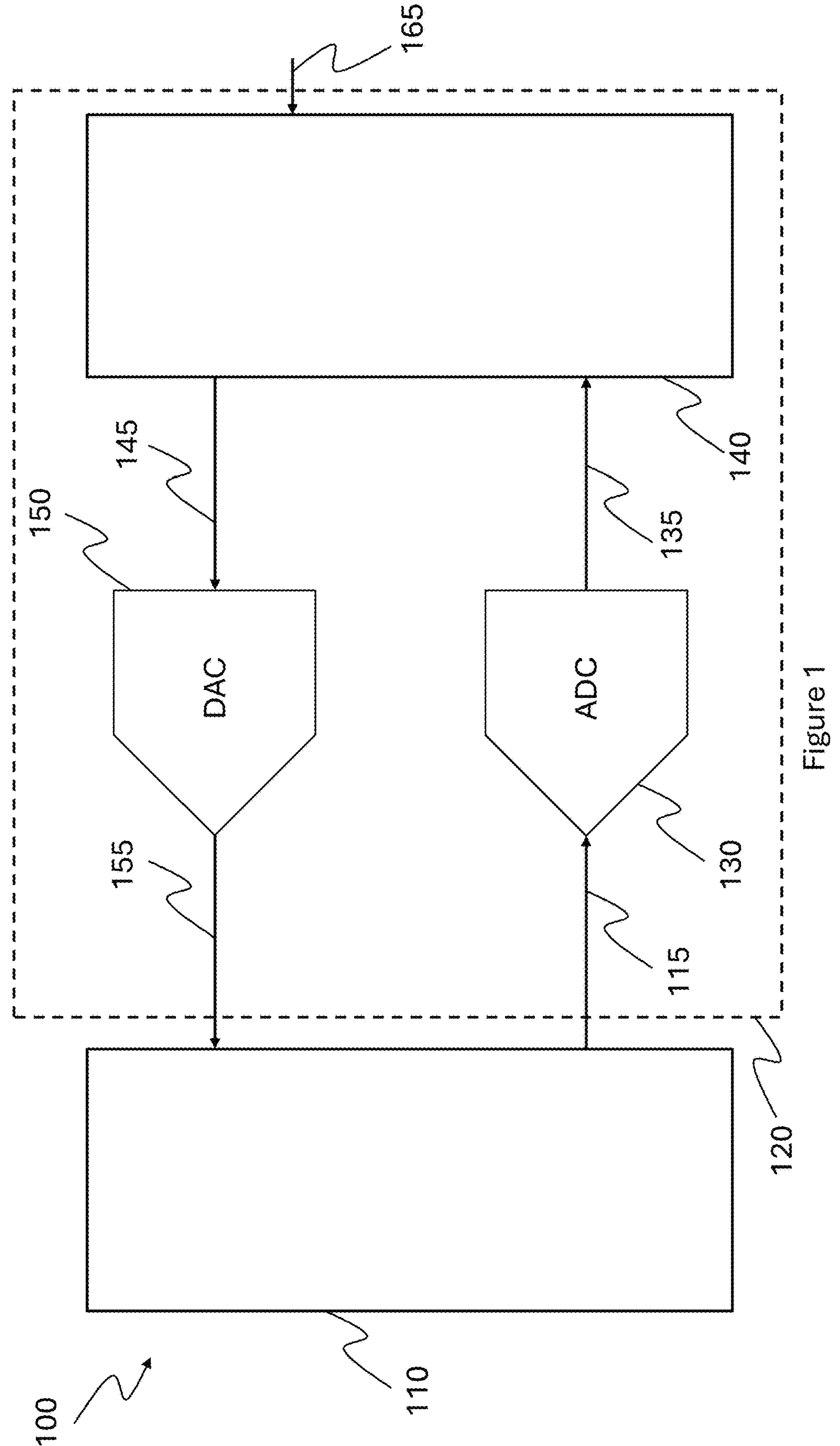
FIG. 1 is a schematic diagram of an example of a data converter or control system comprising data converters.

Electronic circuits may be controlled by feedback-based control systems or control loops. A control system receives an input or feedback signal from a circuit and generates a control signal that is provided to the circuit. The sensing may not be entirely direct e.g. anisotropic magneto resistive (AMR) or hall effect sensor sub-systems. The control system aims to modify the control signal such that the feedback signal operates in a desired manner, such as tracking a reference or target level, value or signal.

In many circuits, the feedback signal is an analog signal. So that the system can operate efficiently, the control system comprises a digital processor or controller which determines the changes required in the control signal to reduce the difference between the feedback signal and the target signal. As such, the feedback signal received from the external circuit is coupled to an analog-to-digital converter, ADC, and converted from an analog signal to a digital signal. The controller receives the converted digital signal and acts to determine a difference between the converted digital signal and a target level or signal. As the control system operates in multiple domains, it may be referred to as a data converter system.

The difference may be referred to as a difference signal. The difference signal that is generated, and any further processing that occurs at the controller or within the data converter system is limited by the limitations of the data converters (e.g. ADCs and/or DACs) within the data converter system, including the analog mixed signal performance and data converter resolution and signal to noise ratio (SNR) performance.

Following the determination of the difference, the controller further acts to determine the difference, change or "delta" required in a digital output word of the controller, such that the difference is reduced. This delta signal may be added to an offset term and scaled before being added to a previously converted digital word, and the new digital word provided to a digital-to-analog converter, DAC. The offset term and scaling may be applied to compensate for the different resolutions of the data converters and offsets within the system. As control systems are typically iterative, the new digital word may be an updated version of the previous digital word. For example, where the difference is a percentage difference, the difference signal may represent said percentage, and the new digital word may be the previous digital word updated by the percentage difference. The difference signal may be any signal representative of a difference between the target signal and the feedback signal, for example, it may be a percentage difference between the signals, an arithmetic function such as the result of a subtraction, a signal that represents a portion of the difference, a ratio etc.

The new digital word is provided to the DAC and converted to an analog output, control or actuation signal. This actuation signal is provided to the external circuit. In this way, the actuation signal is based on a comparison between the feedback signal and the target value.

Providing a conversion from analog to digital and digital to analog slows down the provision of the control signal to the external circuit, delaying the time it takes for the output of the external circuit to meet or settle near to the target value. Any conversion process introduces latency into a data converter system. Further, determining required scaling or offsets to correct for the different resolutions of the data converters introduces latency and processing requirements at the controller. However, converters are necessary to allow the use of a digital controller, firmware controller or software controller. Further, the transmission of the new digital word to the DAC increases interface time and power cost. There is a need to improve the data converter system to reduce latency and power use, providing improved feedback to the external circuit. There is also a need to improve electromagnetic interference (EMI) and electromagnetic coupling (EMC) in data converter systems.

The present inventors have determined that the conversions between different signal types (analog to digital and vice versa) and transmission of data between the different components of the data converter system constitute very significant delays, increasing the power consumption of the data converter system. This is exacerbated in system designs using serial interface variations. Further, the reduction in data communication reduces the EMI magnitude and frequency, at least because EMI may be generated by drivers of intermediate frequency or high frequency signals between the components which have to drive relatively large capacitive loads.

So as to reduce the power consumption, the inventors have determined that the results of conversions may be provided in an improved manner. Edge processing, in which a substantial proportion of the required processing is provided externally to the main controller, reduces the size of transmitted words or signals, reducing the time it takes to transmit serial signals between the components. In particular, the data converter system may be modified such that the data converters perform a substantial proportion of the processing and only a difference signal is determined at the controller, rather than a full digital word. The data converter may further apply an offset term and scaling. The offset term and scaling may be applied to compensate for the different resolutions of the data converters and offsets within the system.

The feedback signal received from the circuit is provided to the ADC and converted from an analog signal to a digital signal. The difference between a level of the converted signal and the target value may be determined in the same way as previously described. Generating a new digital word at the controller to be provided to the DAC based on the difference would create increased latency. Further, converting, using the DAC, a new digital word increases power consumption and latency, as the DAC will act to convert every bit of the new digital word.

Rather than determining, using the processor, a new digital word to be provided to the DAC, the difference signal, representing a difference between the converted signal and target signal, is provided to the DAC. This reduces the processing required at the controller with a reduction in processing delay and power consumption while freeing up the controller to also do other tasks. Further, the difference signal will typically comprise a smaller number of bits than a new digital word, reducing data transmission time. The DAC may then act to generate an actuation or control signal based on the difference. The difference signal itself may be transmitted, or a difference signal that has been further processed, for example to take into account converter resolution may be transmitted. Even with further processing, the signal transmitted from the controller to the DAC is significantly shorter when compared to the transmission of a new word to be converted by the DAC.

The DAC may determine the changes required to a previous digital input word to reduce the provided difference signal. As control systems operate iteratively, the previously converted word may be updated by changing a number of the LSBs of the previous digital word and acting to convert only the LSBs that have changed.

The number of bits required may be substantially lower in a system with a high oversampling ratio, where the oversampling ratio is calculated as the data conversion rate divided by twice the signal bandwidth.

Operating in this manner advantageously reduces the conversion latency and power usage of both the controller and the digital to analog controller.

FIG. 1 is a schematic diagram of a control loop 100 comprising a circuit 110 and a control system or data converter system 120. The circuit 110 may be any circuit that operates under the control of a control or data converter system 120. As such, the circuit 110 may be referred to as an external circuit 110 as it is external to the data converter system 120 but it may be co-integrated with the 110 in the same integrated circuit, system in package or module.

The data converter system comprises an analog to digital converter, ADC, 130, a controller 140 and a digital to analog converter DAC, 150. The data converter system receives an input signal 115. The input signal 115 is coupled from an output of the external circuit 110 and may be referred to as a feedback signal 115. The ADC 130 receives the input signal 115 and converts the signal from analog-to-digital, outputting a converted signal 135. Whilst FIG. 1 shows the circuit 110 directly connected to the ADC 130, it should be understood that the circuit 110 may be indirectly coupled to the ADC 130. For example, the feedback signal from the circuit 110 may be buffered using a buffer, amplified using an amplifier and/or have an offset applied. The feedback signal may also be attenuated. In some situations, the ADC 130 may comprise a resistive divider attenuator at the input, allowing high voltage signals to be scaled, attenuated or reduced to a range which the ADC 130 can tolerate or is specified for. Thin film resistors may be used as part of the resistive divider attenuator, which avoids the integrated circuit diode voltage breakdown mechanism being triggered. The signal may further have a common-mode change applied before being coupled to the ADC 130. This may involve removing or reducing a portion of the common-mode that is present.

The data converter system further comprises a controller 140. The controller may be any suitable form of processor. For example, the controller may comprise at least one of, or a combination of, a microcontroller, a field programmable gate array, FPGA, a programmable logic array, PLA, a central processing unit, CPU, a virtual CPU, vCPU, a neural processing unit, NPU and a graphics processing unit, GPU.

The controller 140 may comprise a firmware or software controller 140. The controller 140 may comprise one or more control inputs 165. The control inputs may control the operation of the controller 140. For example, the control inputs may comprise a communication of a target level or target signal to the controller 140 from an external system. The control inputs may further allow control of digital calibration, dynamic element matching (DEM) and test modes including built in self test (BIST).

The controller 140 is configured to receive the converted signal 135 from the ADC 130. The controller acts to determine, based on the received converted signal 135 and a target signal or target level, a digital output signal 145.

The data converter system further comprises a digital-to-analog converter, DAC, 150. DAC 150 receives the digital output signal 145 and converts the signal from digital to analog, outputting a control signal 155.

The DAC 150 may include embedded digital logic or at least some of the DAC logic may be implemented in the digital controller, 140. Similarly, some the ADC 130 digital processing may be implemented in the digital controller, 140.

Figure 2:
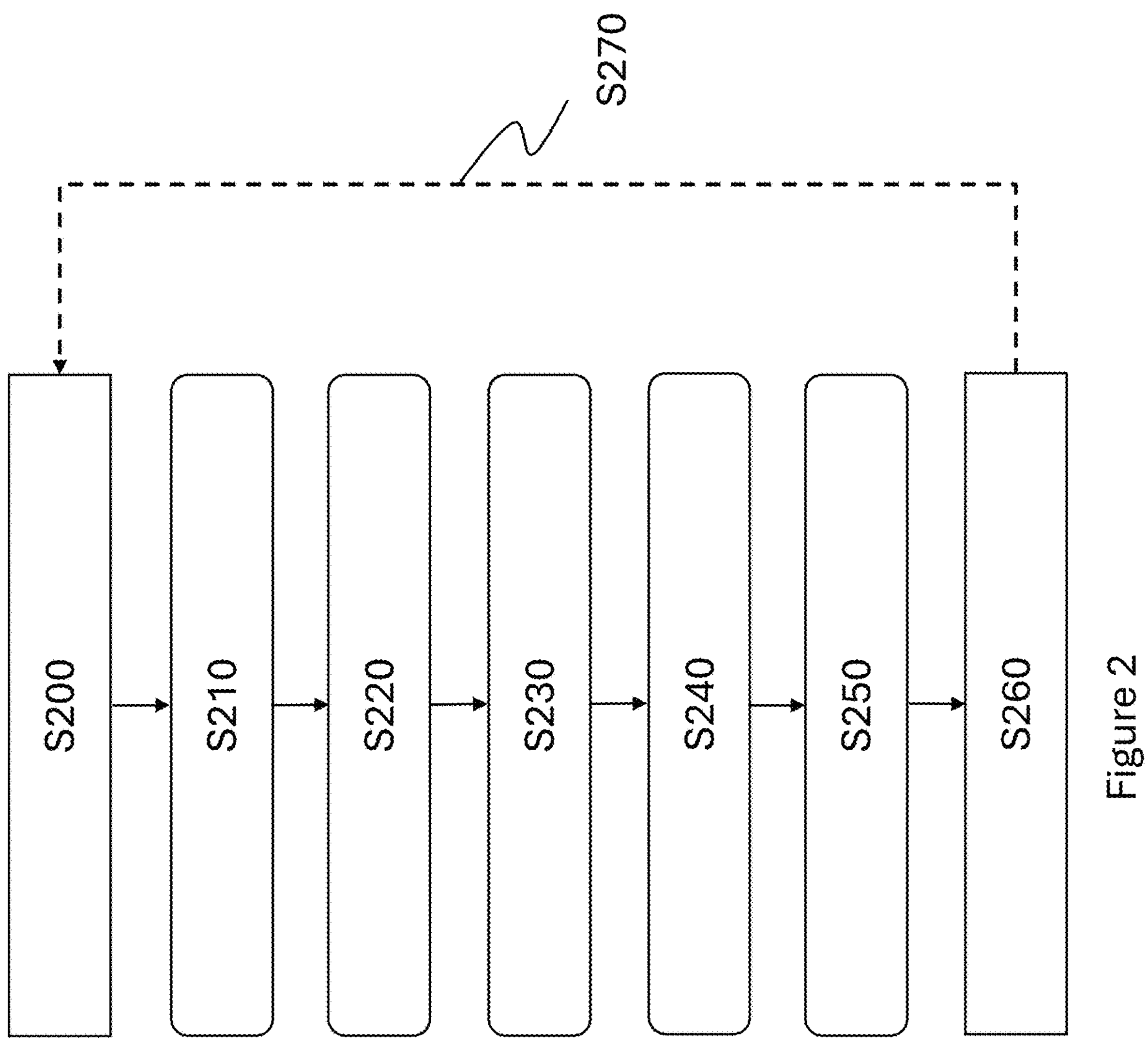
FIG. 2 is a flowchart of an example of a method of controlling the data converter system.

FIG. 2 is a flowchart of a method for data conversion or a method of operating the data converter system 120.

In step S200 the method starts.

In step S210, the method comprises receiving an analog input signal 115 and converting the analog input signal to a digital converted signal 135. The digital converted signal 135 is a digital code or word representing the analog input signal 115.

In step S220, the method comprises comparing the digital converted signal 135 to a target value or target signal to determine a difference signal. The target value or target signal may be received from an external source, pre-programmed and stored in a memory of the system, or react to the changing the digital converted signal 135. The controller 140 may provide offset and scaling features to account for both systemic scaling and data converter differences as well as catering for per-device calibration. The controller may have additional modes of operation including calibration, test-modes, built-in-self-test (BIST) support and dynamic element matching control. The controller may use non-volatile memory. The target value or target signal is a digital code or word, representing a desired output of the circuit 110. The difference signal therefore represents a difference between the target signal and the digital converted signal 135. The difference signal may be the subtraction of the target signal from the digital converted signal 135, or represent a percentage difference between the two values.

In step S230, the method comprises determining the value of a digital output word 145 of the controller 140 that reduces the difference signal between the digital converted signal 135 and the target signal. The digital output word 145 is a digital word or digital code that is a modified version of a previously output digital word. Control systems typically operate iteratively, modifying the previous signal so as to change the operation of the external circuit 110. For example, where the difference signal represents a percentage difference between the digital converted signal 135 and the target value, the digital output word 145 may be the previous digital output word modified by the percentage difference. An offset, scaling or further modifications may be taken into account when creating the digital output word. Where the system has started for the first time, the system may begin operation using an estimated or random digital output word. Where the system has been operating, the previous digital output word may be a word from a previous iteration of the method.

In step S240, the digital output word 145 is communicated to a DAC. FIG. 1 shows a system in which the controller 140 and DAC 150 are separate components, however it should be understood that they may be combined into a single component. Where the components are separate, a communication interface may be used between the components. Parallel communication of the digital output word 145 may be possible, however it is not desirable for moderate to high resolution data converters. Serial communication is preferable to reduce the signal count and required capabilities of the interconnect. Hybrid systems may be used, such as multibit serial. The use of a serial link generally requires the DAC 150 to await all sub-parts of the word 145 to be received before conversion begins, although some part of the digital processing may be possible with part of digital information. This results in latency in the system, due to both the slower transmission and delay whilst the full word is being received, in particular when serial communication is used.

In step S250 the digital output word 145 is converted to an analog control, actuation or biasing output signal 155. The analog control signal is provided, coupled or output to the circuit 110. As such, the data converter system 120 controls the circuit 110 through a modification of the actuation signal 155.

Following the output of the actuation signal 155 in step S250, the method ends S260. The method may be repeated, such that following the end of the method at step S260, the method returns S270 to step S200 and starts again.

As previously described, the determination of the value of the digital output word 145 at the controller and the communication of a new digital word to the DAC 150 increases latency and power consumption. Instead, edge processing may be used to minimise the operations performed by the controller.

Figure 3:
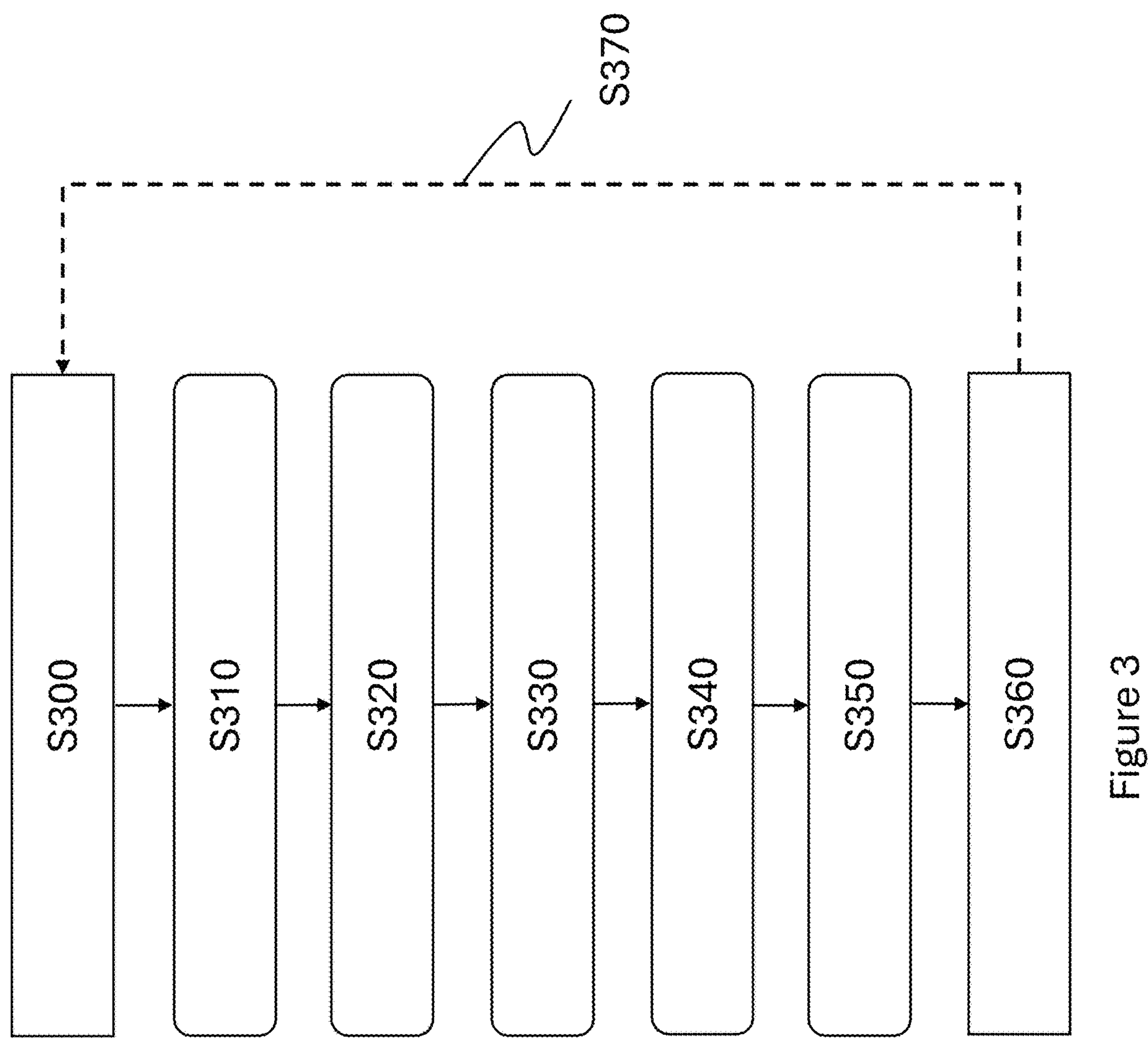
FIG. 3 is a flowchart of an example of a method of controlling the data converter system of FIG. 1 whilst transmitting a reduced digital signal between a controller and converter

FIG. 3 is a flowchart of a method for data conversion or a method of operating the data converter system 120 whilst decreasing latency and power consumption of the controller.

In step S300 the method starts.

In step S310, the method comprises receiving an analog input signal 115 and converting the analog input signal to a digital converted signal 135.

In step S320, the method comprises comparing the digital converted signal 135 to a target value or target signal to generate a difference signal.

As noted previously, the target value or target signal may be received from an external source, pre-programmed and stored in a memory of the system, or react to a change in the digital converted signal 135. The target value or target signal is a digital code or word, representing a desired output of the circuit 110.

The ADC 130 which receives the output 115 of the circuit 110 and generates the digital converted signal 135 of finite resolution, finite SNR and typically has a non-ideal transfer function. Further, the transfer function of the ADC 130 may vary on a device-to-device basis due to process variations, as well as voltage and temperature variations during operation (PVT errors). As such, the digital converted signal 135 may not be an ideal representation of the output of the circuit 110. As the controller aims to determine a difference between the output 115 of the circuit 110, these non-idealities may reduce the accuracy of the data converter system 120.

The target value or target signal may be calculated to be based on or take into account specifications or characterisations of the ADC 130 transfer function and the DAC 150 transfer function. Alternatively, the DAC 150 may take into account the specification of the ADC when determining the digital word to be converted by the DAC 150. ADCs are typically of higher resolution and hence the ADC word may need to be scaled. There may also be differences in nominal reference ranges as well as device-device variations also. These differences can be measured and calibrated out during manufacturing or the user may also be provided this functionality to allow for variance of e.g. the voltage reference and performance optimization in a specific temperature range.

System level calibration is a useful capability and some systems may include monitor functions which may suggest re-calibration if e.g. the temperature, power supply and/or voltage reference changes beyond a specified operation window. Thus, the target value or signal may take into account offset and gain error or zero scale and full-scale errors of the ADC and integral non-linearities of the ADC 130.

The difference signal may be the subtraction of the target signal from the digital converted signal 135 or represent a percentage difference between the two values. As such, the difference signal may represent a difference between the target signal and the digital converted signal 135. In other words, the difference signal represents the desired change in the output of the circuit 110 or a change required in the output of the circuit 110 that would result in a difference signal desirably as close as possible to zero. Further processing of this difference may then be provided by the DAC 150.

Alternatively, the difference signal provided to the DAC 150 may be further processed by the controller 130, such that the controller 130 may determine the change required in the output of the DAC 150 to reduce the size or value of the difference signal. Determining a difference signal in this manner requires the controller 140 to determine the difference signal based on the DAC 150 range, resolution and transfer function. In this way, the difference signal transmitted may be a delta signal, representing the change required in the input digital word to the DAC 150 that is already being converted by the DAC 150 or a change required in the output of the DAC 150.

In step S330, the difference signal 145 is communicated to a DAC. By communicating only a difference signal from which the DAC 150 can determine a new digital word to convert, rather than a digital word to be converted by the DAC, the processing required by the controller is reduced. Further, the length of the communicated difference signal in bits will typically be less than that of the full digital word, reducing system latency in a system that transmits data serially.

The difference signal itself may be communicated or transmitted to the DAC 150. Alternatively, a representation of the difference signal may be communicated or transmitted to the DAC 150.

The representation of the difference signal may comprise a coded version of the difference signal, such as a Huffman code or log magnitude code as explained later. In other examples, the representation of the difference signal may comprise a delta signal (which is related to the difference signal). In other examples, the representation of the difference signal may comprise a filtered version of the difference, a pre-processed version of the difference signal and/or an encrypted version of the difference signal.

Step S340 comprises generating an analog actuation or output signal 155 based on the received difference signal using the DAC 150.

Where the received difference signal is representative of a difference between the target signal and the digital converted signal 135, the DAC may generate a delta signal (a digital signal) representing a change required in the value of the output signal 155 to reduce the difference between the value of the converted signal 135 and the target value. The DAC 150 may then proceed to modify a previously converted digital word by the delta signal and convert this modified signal. Data converter or control systems are typically iterative, therefore a previous digital word that has been converted by the DAC 150 may be stored. When the system is initially turned on, a random or pseudo-random word may be modified or converted to be supplied to the DAC 150. Alternatively, a stored value from a previous operation of the DAC 150 may be used.

Where the received difference signal is representative of a delta signal, representing a change required in the output of the DAC 150 to reduce the value of the difference signal, the DAC 150 may add the delta signal to the previously converted digital word, or modify the previously converted digital word using the delta signal, and convert this modified signal.

The DAC may act, based on the received difference signal, to generate an actuation signal that changes over time in a number of steps to reduce the difference signal. For example, rather than the digital input word to the DAC 150 being changed in a single action to a value predicted to substantially remove any difference between the target value and the input signal in a single change, the digital input signal may be modified over time using a number of interim steps. These interim steps reduce the difference signal over time. As the controller 140 simply supplies a difference signal to the DAC 150, the determination of the interim steps and changes to the DAC 150 input are determined at the DAC. This reduces the number of signals required to be sent from the controller 140 to the DAC 150, as the processing is implemented at the DAC. The communication link between the controller 140 and DAC 150 is unburdened, the processing requirements at the controller 140 are reduced and the DAC operates in an edge processing manner to determine the required changes.

The DAC 150 may be an under-damped, critically-damped or over-damped. Where the DAC is under-damped, the changes to the DAC 150 input based on the difference signal may result in an overshoot in the difference signal or value. For example, the difference signal may change from a positive value to a negative value. An under-damped DAC 150 may be desirable to improve the response or transfer function of the data converter system 120 as a whole, or the operation of the circuit 110 external to the system, which may be over-damped. The under-damping overshoot may provide pre-emphasis for systems further along the signal chain from the DAC 150, improving total system operation. Where the DAC 150 is over-damped, the changes to the DAC 150 input word may result in the difference signal changing over time, such that no overshoot is present in the output of the DAC 150. A critically damped DAC 150 may be considered as an ideal situation in some cases, where the difference signal is removed in one change of the DAC input word. However, due to system tolerances or other attributes, this may be difficult to achieve in practice.

The DAC 150 may take into account scaling and offset modifications when determining the delta signal. Offset and scaling functions are desirably implemented along with or embedded within the DAC 150 as edge processing. Scaling and offset functions take into account non-idealities of different parts of the data converter system 120, such as the transfer function, range and resolution differences between the DAC 150 and ADC 130. The value of the scaling and offset may be set as part of an initial set up of the DAC 150. This may be done each time after power-on if volatile memory is used or to write store these settings in non-volatile memory (NVM) once so that the system will power-up quicker without requiring this initialization phase.

Step S350 comprises outputting the output signal 155 to the circuit 110.

Following the updating of the DAC 150 and output of the actuation signal 155 in step S350, the method ends in step S360. The method may be repeated, such that following the end of the method at step S360, the method returns S370 to step S300 and starts again. The repetition may occur when a new DAC 150 update is required. In particular, where the DAC is used in a multi-update situation, where the DAC signal is updated over time based on a changing in put signal, the method may be repeated.

Following the method of FIG. 3, only the difference signal is transmitted to the DAC 150, not a new digital word to be converted by the DAC. This reduces serial transmission time and power consumption at the controller 140.

The transmission of the difference signal from the controller 140 to the DAC 150 may be further optimised to reduce latency using coding. For example, the transmitted difference or delta signal 145 may be coded using a Huffman code or a log magnitude code. These coding schemes reduce the required number of bits that are transmitted between the controller 140 and the DAC 150. The use of a Huffman code may represent a commonly transmitted signal using a code. The code may be pre-determined and stored at both the controller 140 and the DAC 150. In this way, transmission of the most commonly used or transmitted difference or delta signals may be made more efficient.

The previously described system and method relate to a circuit 110 with an analog output 115, digital controller 140 and analog actuation signal 155. However, it should be understood that the system may operate with a circuit 110 with a digital output 115, analog controller 140 and digital actuation signal 155. As such, the ADC 130 may be referred to as a first converter and the DAC 150 may be referred to as a second converter. The first converter and second converter are of opposite types, and act to convert from either digital to analog or analog to digital.

Communication latency is decreased between the controller 140 and the DAC 150 through transmission of a reduced signal or a difference signal. So as to further decrease latency, the communication of a converted signal 135 between the ADC 130 and the controller 140 may also comprise the communication of a reduced signal or a difference signal, for example a Huffman coded signal or a log-magnitude coded signal, in the same way as described with respect to the difference signal communication between the controller 140 and the DAC 150. This signal may further be pre-processed, encrypted or encoded. Where there is no ADC, for example, where the external circuit 110 provides a digital output as described with respect to FIG. 4, the external circuit may communicate using a reduced signal, or a pre-processing block may process the signal and reduce it in the same manner.

FIG. 1 shows a data converter or control system 120 including two data converters. The control system 120 receives an analog input signal 115 and outputs an analog actuation signal 155. The external circuit 110 described with respect to FIG. 1 is an analog circuit. However, in some situations, the circuit may operate across both the analog and digital domains.

Figure 4:
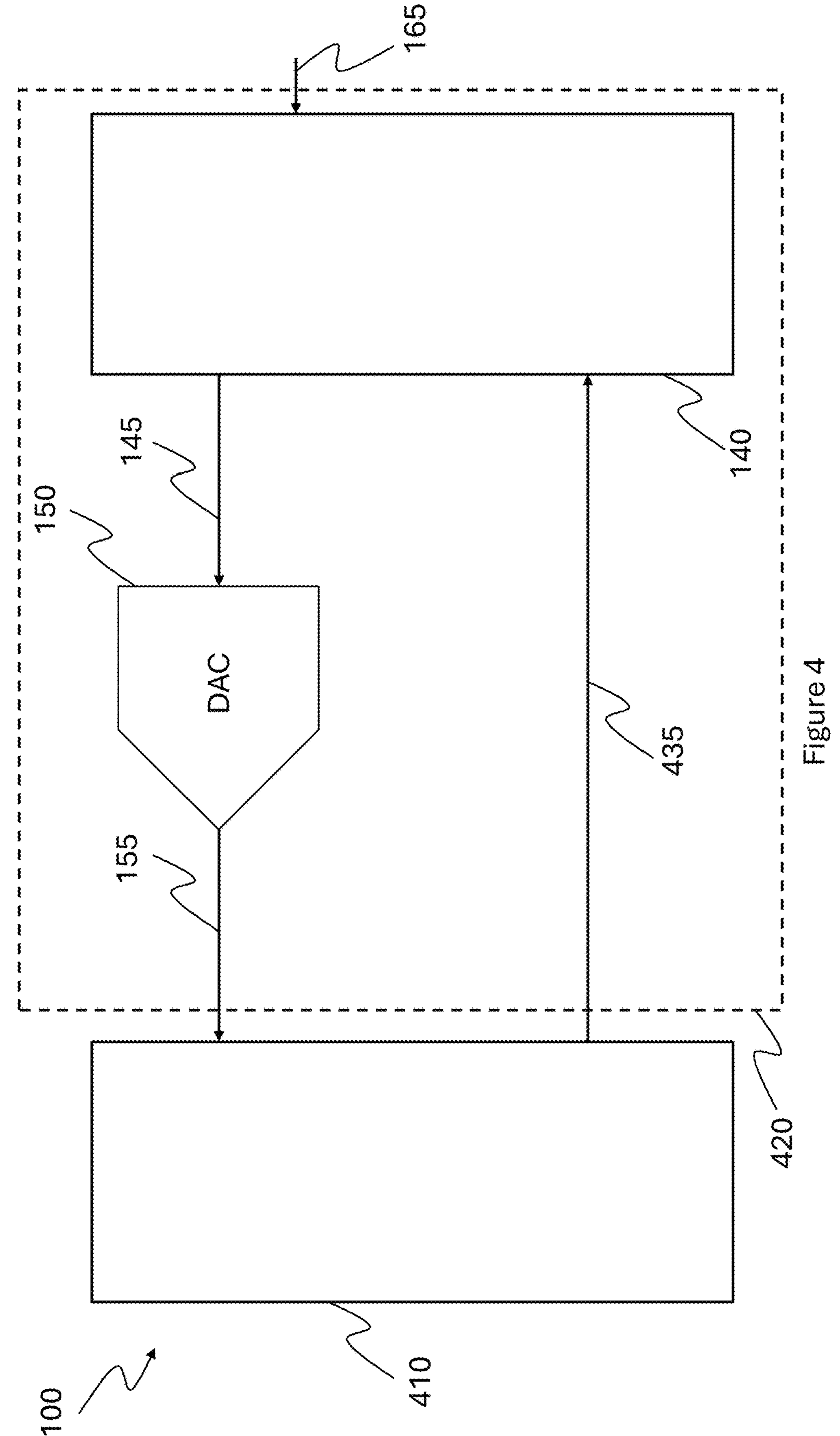
FIG. 4 is a schematic diagram of an example of a data converter system comprising a single data converter.

FIG. 4 is a schematic diagram of a control loop 100 comprising a circuit 410 and a data converter system 420. The circuit 410 may be any circuit that operates under the control of a control or data converter system 420 and operates to receive an analog input signal and output a digital output signal. As such, the circuit 410 may be referred to as an external circuit 610 as it is external to the data converter system 420. The circuit 410 may be co-integrated with the data converter system 420 in the same integrated circuit, system in package or module.

The data converter system 420 receives an input signal 435 from the data converter system 410. The input signal is a digital signal 435. As such, no conversion from analog to digital is required and no ADC is therefore required.

Figure 5:
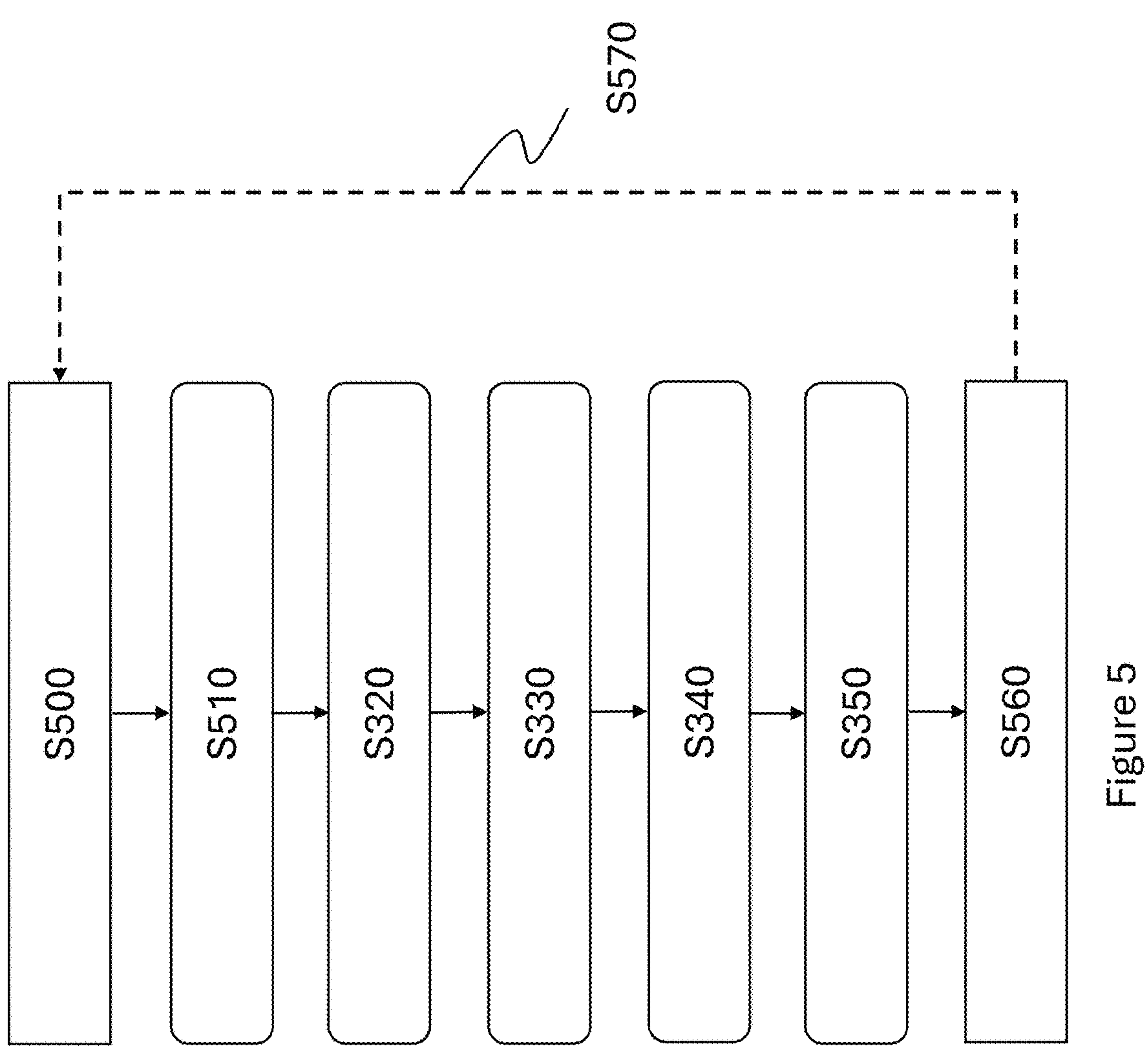
FIG. 5 is a flowchart of an example of a method for controlling the data converter system of FIG. 4.

The operation of the controller 140 and DAC 150 may follow the flowchart shown in FIG. 3, excluding the conversion from analog-to-digital. FIG. 5 is a flowchart of a method for data conversion or a method of operating the data converter system 420 whilst decreasing latency and power consumption of the controller.

In step S500 the method starts.

In step S510, the method comprises receiving a digital input signal 415. No conversion of the digital input signal 415 is required. The digital input signal is provided to the controller 140.

The following steps shown in FIG. 5 are the same as those described with respect to FIG. 3. As such, the operation of steps S320-S350 will not be described further here. Following the updating of the DAC 150 and output of the actuation signal 155 in step S350, the method ends at step S560. The method may be repeated, such that following the end of the method at step S560, the method returns S570 to step S500 and starts again. A system not including an ADC 130 may result in lower latency and reduced computation complexity, as the range or specifications of the ADC 130 do not need to be taken into account.

Figure 6:
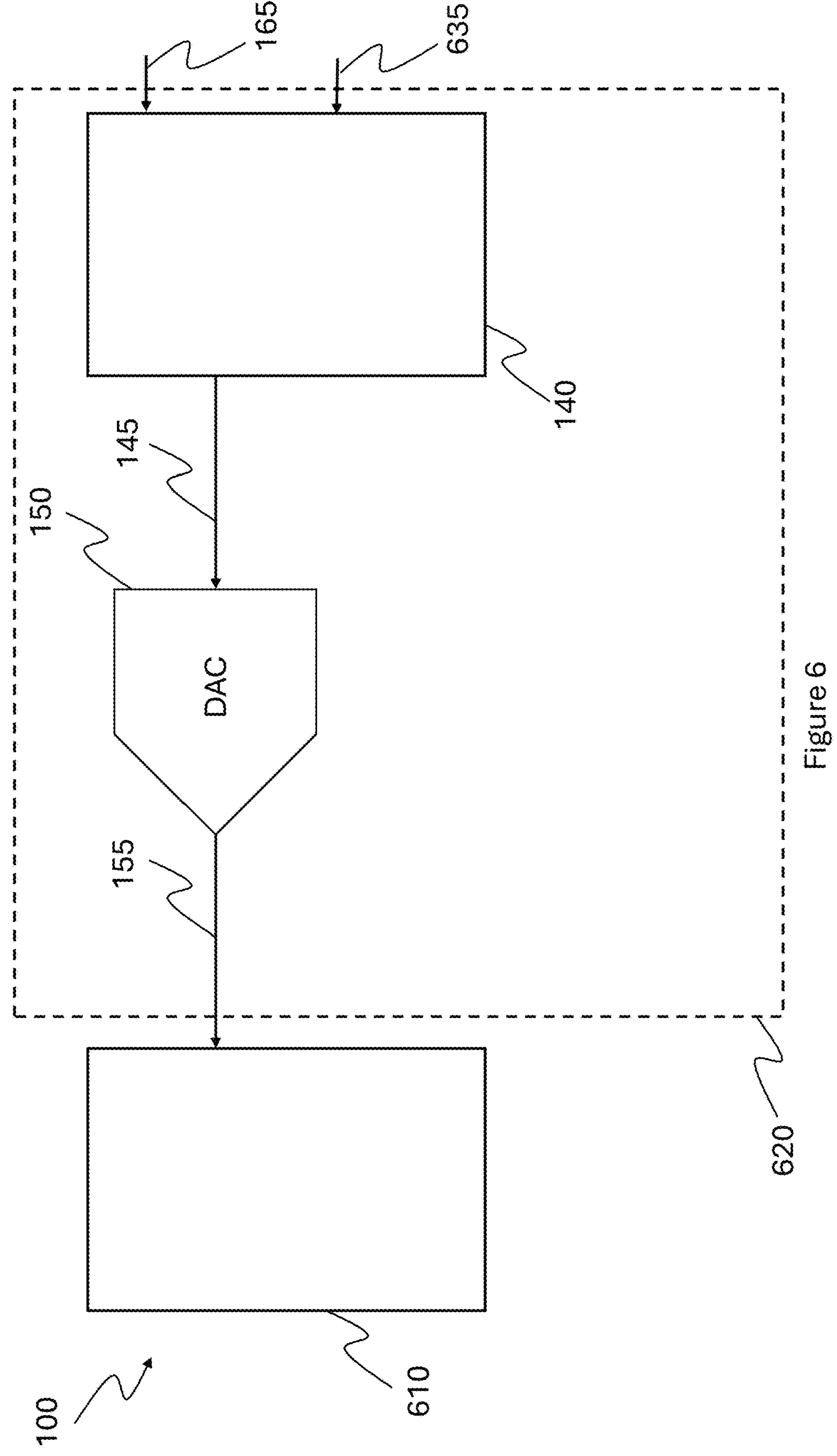
FIG. 6 is an alternative schematic diagram of the example of the data converter system of FIG. 4.

Whilst the input signal 435 shown in FIG. 4 is received from the same circuit 410 as the actuation or output signal 155 is provided to, it should be understood that these signals may be received from and provided or outputted to different systems. FIG. 6 is a schematic diagram of a control loop 100 comprising a circuit 610 and a data converter system 120. The digital input signal 635 is received from a second external circuit or system (not shown). The control system 620 may operate in the same manner as the control system shown in FIG. 4 and the method of FIG. 5.

The system benefits from a reduced latency and power usage due to the improvements to the transmission of data between the controller 140 and the DAC 150.

The operation of the circuit 110, or the input signal 115, 435, 635, may change in a manner that is predictable over time. For example, the target value or signal or the output of the circuit 110 may change in a known manner over time. As such, to reduce data transmission, the DAC 150 or controller 140 may act to monitor and model the behaviour of the circuit 110 to determine the required changes in the output or actuation signal 155. This may allow a reduction in the number of bits transmitted between the controller 140 and DAC 150. The modelling may be performed using a programmable logic array (PLA), field programmable gate array (FPGA), firmware, or software. For example, the modelling may be performed using R™, Python™ or Matlab™ at the DAC 150.

Figure 7:
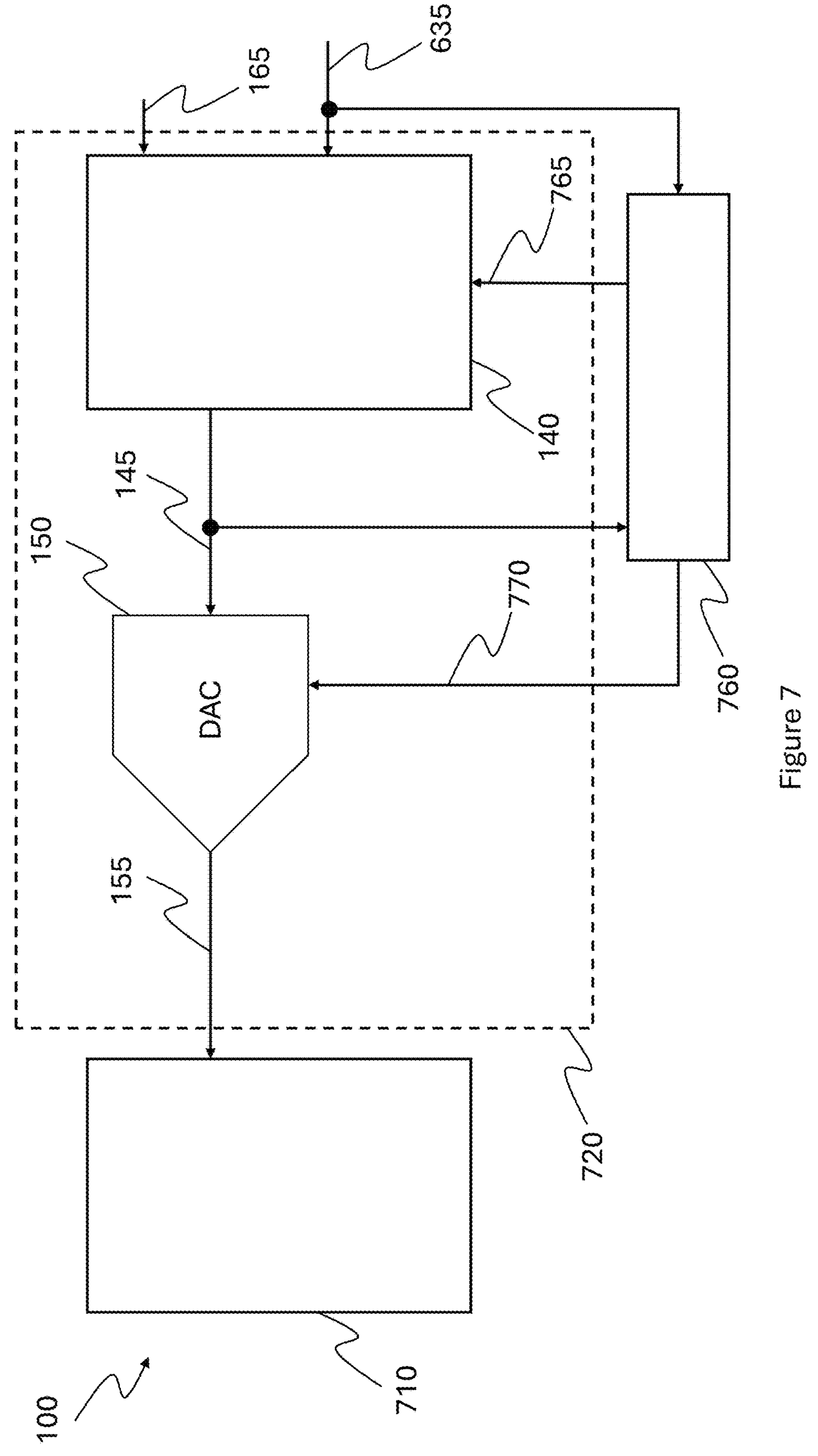
FIG. 7 is a schematic diagram of an example of a data converter system comprising a modelling system.

FIG. 7 is a schematic diagram of a control loop 100 comprising a circuit 710 and a data converter system 720. The system of FIG. 7 is based on that of FIG. 6, however it should be understood that the additional features of FIG. 7 may also be applied to the systems of FIG. 1 or FIG. 4.

FIG. 7 includes a modelling system or circuit 760. The modelling system or circuit is a processor or controller configured to model the response of the controller 140 and DAC 150 to allow a reduction in the complexity of operations performed by the controller 140 and DAC 150. Whilst the modelling system or circuit 760 is shown as a separate component to the controller 140 and DAC 150, it should be understood that the functions of the modelling system or circuit 760 may be implemented within or as part of the controller 140 and/or DAC 150, such that the controller 140 or DAC 150 may comprise the modelling system or circuit 760.

The modelling system or circuit receives the digital input 135, 435, 635 provided to the controller and difference signal 145 output by the controller. The modelling system or circuit 760 is configured to provide a first control signal 765 to the controller 140 and a second control signal 770 to the DAC 150. Whilst the first control signal 765 and second control signal 770 are shown as separate signals provided to the controller 140 and DAC 150 separately, it should be understood that the first 765 and second 770 control signals may be provided to one of the controller 140 or DAC 150, with the controller 140 or DAC 150 then transmitting on the relevant control signal to the other component. If the system is a multi-bit serial system, this may allow a reduction in serial links in the system, reducing the number of interconnects. Alternatively, the number of serial data transfers of multiple bits may be reduced.

Figure 8:
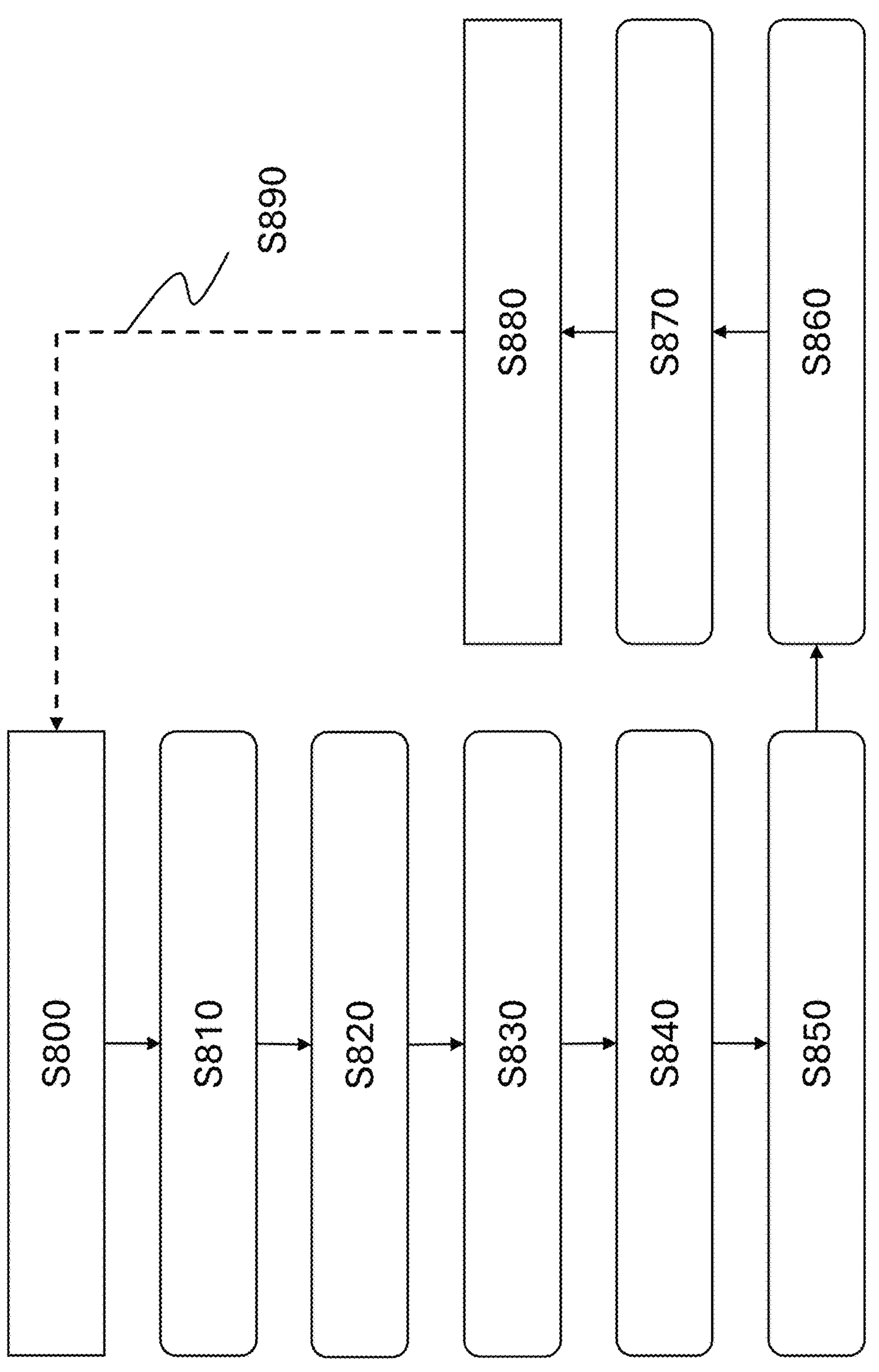
FIG. 8 is a flowchart of an example of a method for training the modelling system of FIG. 7 to control the data converter system using a model.

FIG. 8 is a flowchart of a method for generating a model to decrease latency and power consumption of the controller by modelling expected changes in the difference or delta signal.

The method begins in step S800.

In steps S810-S850, the system is trained based on a number of received inputs and outputs using the modelling system or circuit 760. In training a number of inputs 115 are received, converted by the ADC where an ADC is present, or provided directly to the controller where the input 735 is a digital input, processed by the controller 140 and a difference signal is provided to the DAC 150, which generates a plurality of actuation signals 155. Method steps S810-S850 correspond substantially to steps S210-S250, S310-S350 and S510-S350 of FIGS. 2, 3 and 5.

Once an output signal 155 has been output to the circuit 110, the system may act to repeat steps S310-S350 when an updated input signal 115 is received. The steps may be repeated continuously or periodically, with the input signal 115 being received continuously or periodically. This allows the data converter system 120 to respond to changes in the input signal 115 or changes in the target signal.

Once two or more difference or delta signals have been determined in step S820, resulting in the output of two or more output signals in step S850, the method may comprise, in step S860, transmitting or providing the input or converted signal 635 and the difference signal 145 to the modelling system or circuit S760. This may occur continuously as the signals are generated, or once a number of the signals have been generated following a number of repetitions of the method steps S810-S850.

In step S860, the method comprises comparing the two or more difference or delta signals and the two or more digital input signals 735 to generate a model representing the relationship between the signals. The model accuracy may increase when more difference or delta signals are compared to generate the model. It is recommended to iterate such training and fine tune the model using a representative dataset to enable corresponding efficiencies by optimizing the system for the tasks is it planned to do. It is also important to consider and include boundary and extreme cases to ensure the model can cater for these also.

In step S860, based on the received digital input signals and output of the controller, the model training may recognise that the received signals, including the input signal 635, are periodic or repeated patterns or signals. If this is determined, the model may act to specify this when generating the model or when specifying the model in step S860. As such, the model may be trained to recognise periodic signal, so that when used it can replicate the periodic signals at the DAC 150 with reduce communications between the controller 140 and the DAC 150.

The difference or delta signals 145 represent changes required in the operation of the data converter system 120. As such, the generated model represents a model of how the output 155 of the data converter 120 should change over time to reduce the difference between the converted signal 135 and the target signal. The model may alternatively represent a relationship between the received input signal 635 and the difference signal 145. Once the model has been generated in step S860, the model is provided to the controller 140 and the DAC 15 in step S870.

The model architecture may be defined during manufacture of the system or before the training of the model. The model architecture may therefore be provided to both the control 140 and DAC 150 during manufacture or before training. Generating the model in step S860 may comprise determining the coefficients and tuning of the model based on the received or training data. Following training, the coefficients and tuning of the model, which are determined using the modelling system or circuit 760 during the generation of the model in step S860, may be transmitted to the controller 140 and DAC 150 in step S870.

The model may be a machine learning model generated based on received inputs and outputs of the controller 140, a time series machine learning model comprising a number of filtering effects, a neural network, a deep neural network, a long short-term memory model (LSTM), autoencoder, generative adversarial network (GAN) or a transformer model. Other model types may be used.

The method of generating a model ends at step S880. The model may be trained a single time, reducing system development and deployment cost. This is particularly advantageous in application-specific solutions that use edge processing.

Following the training of the model, and the end of the method at step S880, the model training process may be repeated by returning S890 to step S800. This may comprise retraining or further training of the model. The repetition of the model training may occur intermittently or periodically based on a new data set or new received inputs. The data received by the system may be monitored and the model parameters adjusted continuously or on an on-going basis.

Retraining of the model may take place in an incremental fashion, using reinforcement learning. Incrementally retraining the model results in small changes to the model, such that the model retraining is fast and has little impact on the normal operation of the data converter system.

The model may be updated or retrained using the method of FIG. 8 during an inactive period, such as following power-down of the system, during a sleep mode or during any other inactive time or state. Where the model needs updating and the system is not powered down, the data converter system may halt or stop operation, restarting following the model update.

The data converter system may have multiple use cases with significantly different properties or operation types. So as to improve system operation, multiple models may be trained based on the different operation types, such that the data converter system can change operation to use a different model as the operation changes. This may involve swapping from one mode to another by loading and using the relevant coefficients, where the multiple models or coefficients are stored within a memory of the data converter system. The use of multiple models may allow the system to operate using the most optimized model, offering significant improvements compared to the use of a single, more generalised model.

The model may be used by the controller 140 and DAC 150 to reduce the need to transmit information or difference signals from the controller 140 to the DAC 150, as the DAC 150 is able to determine how the output 155 of the data converter system 120 should change but there may be exception cases and the controller will communicate the difference between the expected response and the actual target response. This allows for change and e.g. stopping transmission of a signal. Difference or delta signals may still be transmitted from the controller 140 to the DAC 150 to allow the model to be updated, continuously improved or compared to real results. Error correction coding (ECC) or cyclic redundancy checking (CRC) may also be used to increase robustness and/or provide enhanced functional safety.

Following the generation of the model, the converter 140 and DAC 150 may act to reduce the difference signal 145 transmitted between the components based on a shared knowledge of the model. As the model is provided to both components, the system may only transmit data relating to changes that are beyond the modelled properties. Once the model has been generated, for example following manufacture of the system or calibration of the system, the modelling system or circuit 760 may be removed and not form part of the system, at least because the model has already been generated. As such, the modelling system or circuit 760 may be an off-chip calibration component, and during operation the data converter may appear as shown in FIGS. 1, 4 and 6, without the modelling system or circuit 760.

Figure 9:
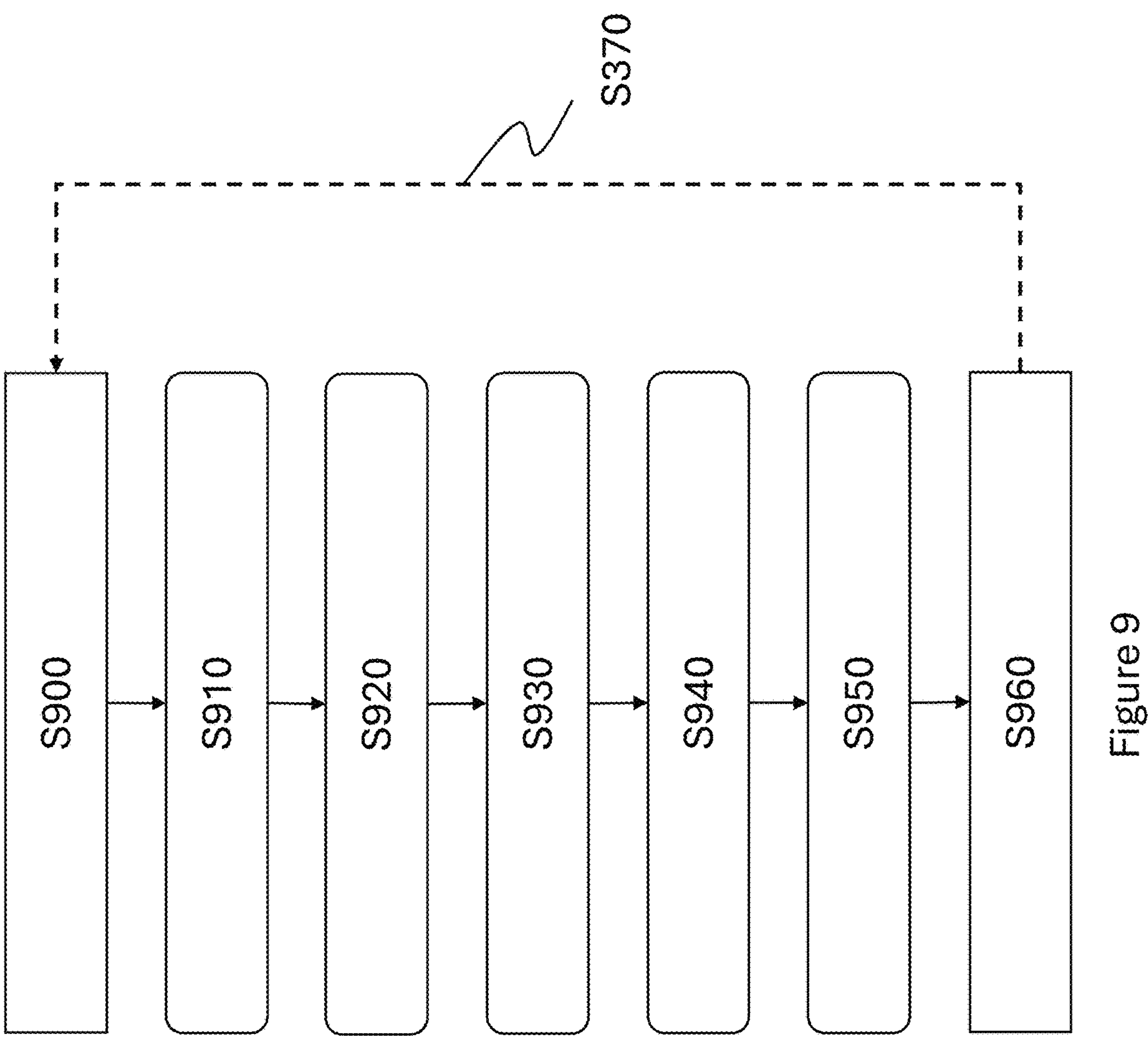
FIG. 9 is a flowchart of an example of a method for using the generated model.

FIG. 9 is a flowchart of a method for using a model to decrease latency and power consumption of the controller by modelling expected changes in the difference or delta signal.

The method beings at step S900.

In step S910, the method comprises receiving an analog input signal 115 and converting the analog input signal to a digital converted signal 135 (in the system of FIG. 1) or receiving a digital input signal 135 and providing the signal to the controller 140.

In step S920, the method comprises, determining a reduced output signal of the controller 140 to be provided to the DAC 150 based on the previously generated model. As the model and model configuration information such as coefficients and model tuning information is provided to both the controller 140 and DAC 150 following training, the output signal may be a reduced version of the difference signal, with a shorter signal length or size. The reduced difference signal may represent a difference between the expected operation of the model and the required difference signal based on the received input signal 635.

Where the changes in the received input signal 635 are periodic or repetitive, the model may have been configured to recognise this. As such, communication between the controller 140 and DAC 150 may be minimised, and instead only changes to the patterns may be communicated between the devices. In this manner, the DAC 150 acts as a peripheral device and the controller 140 controls its operation.

In step S930, the reduced output signal is communicated to the DAC 140.

In step S940, the DAC generates an actuation signal based on the reduced output signal communicated from the controller 140. The model implemented at the DAC 150 and controller 140 aims to reduce the signal traffic between the components, learning from the training data how the DAC should respond in response to a received digital converted signal 135. As such, the difference signal may be reduced to a smaller signal, as the DAC will be able to understand how the reduced output signal is developed by considering the model.

In step S950 the DAC 150 outputs the actuation signal 155.

In step S960 the method ends. The method may be repeated, such that following the end of the method at step S960, the method returns S970 to step S900 and starts again.

The model that is generated in the method of FIG. 8 may be valid for a period of time, until the digital converted signal or digital signal 135 received from the circuit 110 results in a delta signal that does not follow the generated model. This may be determined at the controller 140. As such, the method shown in FIG. 9 may be repeated periodically or continuously as new input signals 635 are received.

Figure 10:
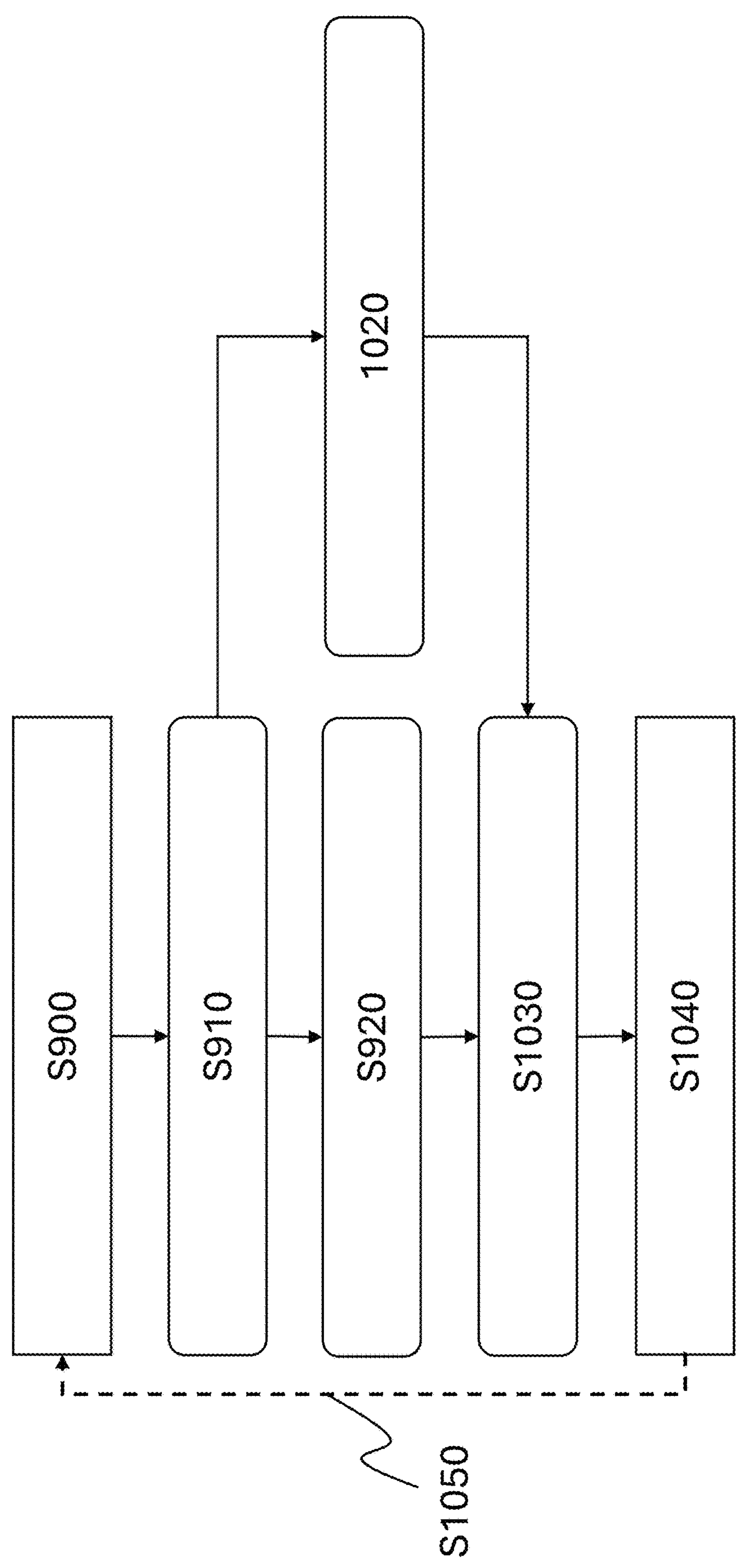
FIG. 10 is a flowchart of an example of a method for verifying the generated model.

FIG. 10 is a flowchart of a method for using a model to decrease latency and power consumption of the controller by modelling expected changes in the difference or delta signal, whilst determining whether the previously developed model accurately represents the changing values of the difference or delta signal.

Whilst the method is operating to determine an output signal 145 using the model at the controller 140, the system may further determine a difference signal using the method according to FIG. 3 or FIG. 5.

In step S910, the method comprises receiving an analog input signal 115 and converting the analog input signal to a digital converted signal 135 (in the system of FIG. 1) or receiving a digital input signal 135 and providing the signal to the controller 140.

In step S920, the method comprises, determining a reduced output signal of the controller 140 to be provided to the DAC 150 based on the previously generated model. As the model is provided to both the controller 140 and DAC 150 following training, the output signal may be a reduced version of the difference signal, with a shorter signal length or size.

In step S1020, the method comprises determining a difference signal based on the received converted signal. Step S1020 may be considered to be an optional step. Instead, step S1020 may be combined with or incorporated as part of step S920. For example, the determinations may take place at the same time.

In step S1030, the method comparing the updated difference signal to a difference signal generated by the model. The difference between the updated difference signal and the difference signal generated by the model represents an error in the model stored at the DAC 150 and controller 140. As such, following the determination of the error, the model may be updated or re-generated following the method of FIG. 9. This allows the model to update over time. The method ends at step S1040. The method may be repeated, such that following the end of the method at step S1040, the method returns S1050 to step S900 and starts again.

The quantized nature of the arithmetic and the quantization of the DAC converters can be modelled and taken into account. The impact of such quantization noise may be understood and the signal may be truncated or rounded. Quantization noise may also be noise shaped by the model if/as desired.

The data converter system 120, 420, 620, 720 may be implemented at least partly as an integrated circuit, as a system on chip (SoC), system in a package (SiP) or as a module. Part of the data converter system may be implemented as an integrated circuit, whilst part may be virtualised using software or cloud infrastructure. The controller 140 may be implemented as a digital system, a programmable logic array (PLA), field programmable gate array (FPGA), as firmware or software. The data converters, DACs or ADCs, may be any of the numerous known types of data converters.

The data converter system 120, 420, 620, 720 may include or comprise other modes of operation in addition to those described previously. Whilst the controller 140 communicates a difference signal to the DAC 150 to reduce latency, during a debug or failure analysis mode, a full digital word (similar to that described with respect to FIG. 2) may instead be transmitted. In some cases, the system may enter a failure analysis mode, in which difference signals are no longer transmitted and the full digital word is transmitted. This ensures that the communicated word is accurate, allowing analysis of how the difference signal or model system may be operating in error.

Further, the DAC 150 and converter 140 may include optimisation for transmission of a stop signal, which stops the operation of the DAC 150 converting. Instead of allowing the system to slowly reduce the output of the DAC 150 over time where the system is a model-based system, the stop signal ensures that any periodic changes in the DAC 150 may be stopped in a time-efficient manner.

Various modifications whether by way of addition, deletion, or substitution of features may be made to the above described examples to provide further examples, any and all of which are intended to be encompassed by the appended claims.

Numbered Aspects:

By way of non-limiting example, some aspects of the disclosure are set out in the following numbered aspects.

Aspect 1. A method of operating a data converter system, the method comprising:

receiving an input signal at the data converter system;

determining, by a controller of the data converter system, a difference between a value of the input signal and a target value;

communicating the difference from the controller to a data converter of the data converter system;

generating, by the data converter, an actuation signal based on the difference;

outputting the actuation signal in order to control a circuit external to the data converter system.

Aspect 2. The method according to Aspect 1, further comprising:

generating a delta signal representing a change in a required value of the actuation signal to reduce the difference between the value of the input signal and the target value.

Aspect 3. The method according to Aspect 2, wherein the delta signal is generated using the controller.

Aspect 4. The method according to Aspect 2, wherein the delta signal is generated using the data converter.

Aspect 5. The method according to any preceding Aspect, wherein the input signal, target value, and actuation signal comprise signals of a first signal type and a second signal type.

Aspect 6. The method according to Aspect 5, wherein generating the actuation signal comprises converting the delta signal from the second signal type to the first signal type.

Aspect 7. The method according to any of Aspect 5 or Aspect 6, wherein the input signal is a second signal type and the actuation signal is a first signal type.

Aspect 8. The method according to Aspect 5 or Aspect 6, wherein the input signal is of the first signal type and the actuation signal is of the first signal type, and wherein the method further comprises:

converting, by a first data converter, the input signal from the first signal type to the second signal type to generate a converted signal, and wherein determining a difference between the level of the input signal and the target value comprises determining a difference between a level of the converted signal and the target value.

Aspect 9. The method according to any of Aspects 5 to 8, wherein the first signal type is an analog signal and wherein the second signal type is a digital signal.

Aspect 10. The method according to any of Aspect 5 to 8, wherein the first signal type is a digital signal and wherein the second signal type is an analog signal.

Aspect 11. The method according to any preceding Aspect, further comprising:

applying, by the data converter, an offset factor before generating the actuation signal.

Aspect 12. The method according to any preceding Aspect, wherein the controller comprises at least one of:

a microcontroller;

a field programmable gate array, FPGA;

a programmable logic array, PLA;

a central processing unit, CPU;

a virtual central processing unit, vCPU;

a neural processing unit, NPU; and a graphics processing unit, GPU.

Aspect 13. The method according to any preceding Aspect, wherein the data converter is a DAC.

Aspect 14. The method according to any of Aspects 1-12, wherein the data converter is an ADC.

Aspect 15. The method according to any preceding Aspect, wherein the difference comprises a Huffman code of the difference.

Aspect 16. The method according to any preceding Aspect, wherein the difference comprises a log magnitude code of the difference.

Aspect 17. The method according to any preceding aspect, wherein communicating the difference comprises communicating at least one of:

a filtered version of the difference;

a pre-processed version of the difference;

an encrypted version of the difference.

Aspect 19. The method according to Aspect 2, wherein communicating the difference comprises communicating the delta signal.

Aspect 20. The method according to any preceding Aspect, wherein receiving the input signal comprises receiving a feedback signal from the circuit external to the data converter system.

Aspect 21. The method according to any preceding Aspect, wherein the target value is a desired output signal of the circuit external to the data converter system.

Aspect 22. The method of operating the data converter according to any of Aspects 2-4, further comprising:

generating a second delta signal;

comparing the delta signal, the second delta signal and respective input signals to generate a model representing the change between the delta signal and the second delta signal.

Aspect 23. The method of operating the data converter according to Aspect 22, further comprising:

generating a third delta signal based on the model.

Aspect 24. The method according to Aspect 22 or 23, wherein the model comprises a machine learning model.

Aspect 25. The method according to any of Aspects 22-24, further comprising generating a plurality of delta signals based on the model.

Aspect 26. The method according to any of Aspects 21-25, wherein the model is a machine learning model configured to update based on changes in the input signal.

Aspect 27. A data converter system configured to receive an input signal and output an actuation signal, wherein the data converter system comprises:

a controller configured to receive the input signal and determine a difference between a value of the input signal and a target value;

a data converter configured to receive the difference from the controller and generate an actuation signal based on the difference, the data converter configured to output the actuation signal in order to control a circuit external to the data converter system.

Aspect 28. The data converter system according to Aspect 27, wherein the data converter is further configured to generate a delta signal representing a change in a required value of the actuation signal to reduce the difference between the value of the input signal and the target value.

Aspect 29. The data converter system according to any of Aspects 27 or 28, wherein the input signal, target value, and actuation signal comprise signals of a first signal type and a second signal type.

Aspect 30. The data converter system according to Aspect 29, wherein the input signal is of the first signal type, and wherein the system further comprises:

a first data converter configured to receive the input signal and generate a converted signal of the second signal type, and wherein determining a difference between the value of the input signal and the target value comprises determining a difference between a value of the converted signal and the target value.

Aspect 31. The data converter system according to Aspect 30, wherein the first data converter is an analog to digital converter, ADC.

Aspect 32. The data converter system according to any of Aspects 27-31, wherein the data converter is a digital to analog converter, DAC.

Aspect 33. A control system comprising the data converter system according to any of Aspects 27-32, wherein the control system further comprises:

a circuit external to the data converter system, the circuit external to the data converter system configured to provide the input signal to the data converter system and receive the actuation signal from the output of the data converter system.

Aspect 34. A method of operating a data converter system, the method comprising:

receiving a digital input signal at the data converter system;

determining, by a controller of the data converter system, a difference between a value of the digital input signal and a target value;

communicating the difference from the controller to a digital-to-analog converter, DAC, of the data converter system;

generating, by the DAC, an analog actuation signal based on the difference;

outputting the actuation signal in order to control a circuit external to the data converter system.

The invention claimed is:

1. A method of operating a data converter system, the method comprising:

receiving an input signal at the data converter system;

determining, by a controller of the data converter system, a difference between a value of the input signal and a target value;

communicating the difference from the controller to a data converter of the data converter system;

generating, by the data converter, an actuation signal based on the difference;

outputting the actuation signal in order to control a circuit external to the data converter system.

2. The method according to claim 1, further comprising:

generating a delta signal representing a change in a required value of the actuation signal to reduce the difference between the value of the input signal and the target value.

3. The method according to claim 2, wherein the delta signal is generated using the controller.

4. The method according to claim 2, wherein the delta signal is generated using the data converter.

5. The method according to claim 1, wherein the input signal, target value, and actuation signal comprise signals of a first signal type and a second signal type.

6. The method according to claim 5, further comprising generating a delta signal representing a change in a required value of the actuation signal to reduce the difference between the value of the input signal and the target value, and wherein generating the actuation signal comprises converting the delta signal from the second signal type to the first signal type.

7. The method according to any claim 5, wherein the input signal is a second signal type and the actuation signal is a first signal type.

8. The method according to claim 5, wherein the input signal is of the first signal type and the actuation signal is of the first signal type, and wherein the method further comprises:

converting, by a first data converter, the input signal from the first signal type to the second signal type to generate a converted signal, and wherein determining a difference between a level of the input signal and the target value comprises determining a difference between a level of the converted signal and the target value.

9. The method according to claim 5, wherein the first signal type is an analog signal and wherein the second signal type is a digital signal.

10. The method according to claim 5, wherein the first signal type is a digital signal and wherein the second signal type is an analog signal.

11. The method according to claim 1, wherein the data converter is a DAC.

12. The method according to claim 1, wherein the difference signal comprises a Huffman code.

13. The method according to claim 2, further comprising:

generating a second delta signal;

comparing the delta signal, the second delta signal and respective input signals to generate a model representing the change between the delta signal and the second delta signal.

14. The method according to claim 13, further comprising:

generating a third delta signal based on the model.

15. The method according to claim 13, wherein the model comprises a machine learning model.

16. A data converter system configured to receive an input signal and output an actuation signal, wherein the data converter system comprises:

a controller configured to receive the input signal and determine a difference between a value of the input signal and a target value;

a data converter configured to receive the difference from the controller and generate an actuation signal based on the difference, the data converter configured to output the actuation signal in order to control a circuit external to the data converter system.

17. The data converter system according to claim 16, wherein the data converter is further configured to generate a delta signal representing a change in a required value of the actuation signal to reduce the difference between the value of the input signal and the target value.

18. The data converter system according to claim 16, wherein the input signal is of a first signal type, and wherein the system further comprises:

a first data converter configured to receive the input signal and generate a converted signal of a second signal type, and wherein determining a difference between the value of the input signal and the target value comprises determining a difference between a value of the converted signal and the target value.

19. A control system comprising the data converter system according to claim 16, wherein the control system further comprises:

a circuit external to the data converter system, the circuit external to the data converter system configured to provide the input signal to the data converter system and receive the actuation signal from the output of the data converter system.

20. A method of operating a data converter system, the method comprising:

receiving a digital input signal at the data converter system;

determining, by a controller of the data converter system, a difference between a value of the digital input signal and a target value;

communicating the difference from the controller to a digital-to-analog converter, DAC, of the data converter system;

generating, by the DAC, an analog actuation signal based on the difference;

outputting the actuation signal in order to control a circuit external to the data converter system.

* * * * *